United States Patent
Sheynis et al.

(10) Patent No.: US 6,683,789 B1
(45) Date of Patent: Jan. 27, 2004

(54) ELECTRONIC CONTROL MODULE FOR A REMOVABLE CONNECTOR AND METHODS OF ASSEMBLING SAME

(75) Inventors: Romy Sheynis, Evanston, IL (US); Mark D. Gunderson, Gurnee, IL (US); Stanton Rak, Evanston, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/424,601

(22) Filed: Apr. 28, 2003

(51) Int. Cl.[7] .................................................. H05K 5/06
(52) U.S. Cl. ...................... 361/752; 361/797; 361/800; 361/791; 361/776; 439/76.2; 439/949; 439/74
(58) Field of Search ................................. 361/752, 797, 361/800, 724, 714, 730, 760, 736, 748, 791, 776; 439/76.2, 75, 62, 949, 74

(56) References Cited

U.S. PATENT DOCUMENTS

| | | |
|---|---|---|
| 5,190,483 A | 3/1993 | Viselli |
| 5,221,210 A | 6/1993 | Bormuth et al. |
| D359,724 S | 6/1995 | Baginy et al. |
| 5,695,355 A | 12/1997 | Hasenfratz et al. |
| 5,754,404 A | 5/1998 | Biermann et al. |
| 5,764,487 A * | 6/1998 | Natsume ..................... 361/775 |
| 5,791,932 A | 8/1998 | Hasenfratz |
| 5,872,333 A * | 2/1999 | Uezono et al. ............... 174/55 |
| 5,985,695 A * | 11/1999 | Freyman et al. ............ 438/112 |
| 6,000,952 A * | 12/1999 | Gladd et al. ................ 439/76.2 |
| 6,192,570 B1 * | 2/2001 | Traver et al. .............. 29/426.4 |
| 6,350,949 B1 * | 2/2002 | Boyd ....................... 174/50.5 |
| 6,464,532 B1 | 10/2002 | L'Abbate et al. |
| 6,527,600 B2 | 3/2003 | Alonso Merino et al. |
| 6,540,526 B2 | 4/2003 | Toda |

FOREIGN PATENT DOCUMENTS

JP  2002/25720  1/2002

OTHER PUBLICATIONS

"DL/DLM/DLD Zero Insertion Force Connectors." *ITT Industries* 1999.

* cited by examiner

Primary Examiner—Randy Gibson
Assistant Examiner—Hung Bui
(74) Attorney, Agent, or Firm—Thomas V. Miller; Brian M. Mancini

(57) ABSTRACT

An electronic control module (20) comprising a housing (30), a printed circuit board (40), and a rigidizer (50). The housing (30) has an opening or window (34) for a removable connector (22). The printed circuit board (40) has a first side (42), a second side (44), and a plurality of contact pads (46). The first side (42) of the board (40) is used to retain components and circuitry. The plurality of contact pads (46) is positioned on the first side (42) of the printed circuit board (40). The rigidizer (50) is attached to the second side (44) of the printed circuit board (40) and provides structural backing for the printed circuit board (40) to compensate for any pressure induced to the first side (42) of the printed circuit board (40) by the removable connector (22). The window (34) in the housing (30) is positioned adjacent to the plurality of contact pads (46) on the first side (42) of the printed circuit board (40) to provide a single opening to each of the contact pads (46). There is also method of assembling the electronic control module (20).

21 Claims, 3 Drawing Sheets

ELECTRONIC CONTROL MODULE FOR A REMOVABLE CONNECTOR AND METHODS OF ASSEMBLING SAME

FIELD OF THE INVENTION

This invention in general relates to electronic control modules and, more particularly, to an electronic control module that has a mechanism to receive a removable connector and methods of assembling the same.

BACKGROUND OF THE INVENTION

Engine mounted electronic control modules for vehicular engines are subject to harsh environments including a high level of heat and vibration. In these applications, electronic components and circuits are formed on a printed circuit board and enclosed within a protective housing. It has been known to provide an electrical connection to the components and circuits on the printed circuit board through a connector that is integrated into the protective housing.

In the past, such integrated connectors have tended to be relatively large and provide inefficient use of board space. Additionally, such integrated connectors are typically expensive and may be one of the highest cost items for the control module. Moreover, the housing must be redesigned if the number or configuration of external connections changes. Accordingly, connectors integrated into the housing of a control module are not easily adaptive to design changes or upgrades.

A need exists to improve current electronic control modules, especially in automotive applications. In particular, there is a need for improved ways to provide an approach that reduces the number of parts, reduces the design complexity and manufacturing process, and lowers the overall cost of the module. This is especially important in high volume applications. However, any improved device should not sacrifice the need for a sealed cavity around the components and circuitry. Additionally, it would be beneficial to have an improved device and method that could be adaptive to design changes in the printed circuit board without requiring modification to the protective housing. It is, therefore, desirable to provide an improved electronic control module and methods of assembling the same.

Figure 1:
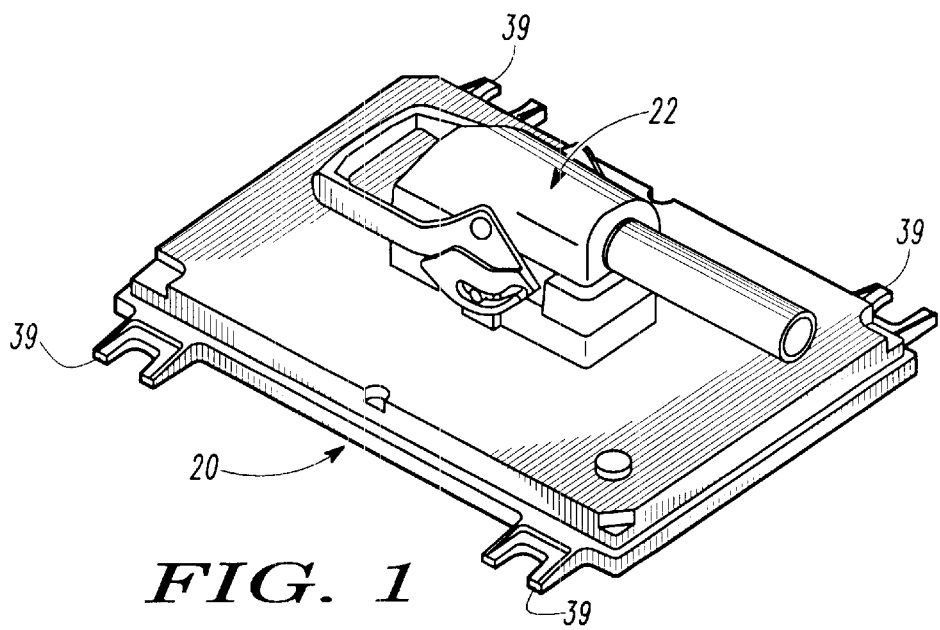
FIG. 1 is a perspective view of an electronic control module having an attached removable connector according to one embodiment of the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a module for connecting components and circuits on an internal board to the external environment and methods of assembling the same. For purposes of illustration, an example of the module and method will be described in the context of an electronic control module for a vehicle. However, the present invention is not limited to modules for vehicles but may also apply to other housings or devices where a robust unit and sealed connection is needed.

To this end, generally, in one embodiment there is an electronic control module comprising a housing, a printed circuit board, and a rigidizer. The housing has an opening or window for a removable connector. The printed circuit board has a first side, a second side, and a plurality of contact pads. The first side of the board is used to retain components and circuitry. The plurality of contact pads is positioned on the first side of the printed circuit board. The rigidizer is attached to the second side of the printed circuit board and provides structural backing for the printed circuit board to compensate for any pressure induced to the first side of the printed circuit board by the removable connector. The window in the housing is positioned adjacent to the plurality of contact pads on the first side of the printed circuit board to provide a single opening to each of the contact pads.

The housing may further include a shroud that surrounds an outer perimeter of the window and extends outwardly from a main body portion of the housing. The shroud may have a latching mechanism for the removable connector. Additionally, the electronic control module may include a sealing gasket that is positioned adjacent to the outer perimeter of the window in the housing. The gasket helps provide a sealed cavity around the components and circuitry on the printed circuit board. The electronic control module may further include an alignment mechanism. In one embodiment, the alignment mechanism includes an alignment hole in the printed circuit board and an alignment dimple in the rigidizer. The alignment hole and the alignment dimple are configured to receive an alignment pin located on the removable connector. In a further embodiment, shroud may have a set of key slots to assist in aligning the removable connector to the housing. Moreover, an interior surface of the shroud may have a gasket to provide a seal to the contact pads.

In another embodiment, there is an electronic control module that comprises of a printed circuit board, a housing, and a rigidizer. The printed circuit board has a first side, a second side, and a plurality of contact pads. The first side is used to retain components and circuitry as well as the contact pads. The housing has an opening for a removable connector. The opening is positioned adjacent to the plurality of contact pads on the first side of the printed circuit board to provide access to each of the contact pads. The rigidizer is attached to the second side of the printed circuit board and the housing. The rigidizer provides structural backing for the printed circuit board to compensate for any pressure induced to the first side of the printed circuit board by the removable connector.

The present invention also includes a method for assembling an electronic control module that is capable of receiving a removable connector. The method comprises the steps of: providing a printed circuit board having a first side, a second side, and a plurality of contact pads, the plurality of contact pads on the first side of the printed circuit board; providing a rigidizer; attaching the rigidizer to the second side of the printed circuit board; providing a housing having a window for the removable connector; aligning the plurality of contact pads on the first side of the printed circuit board adjacent to the window in the housing such that the window in the housing provides a single opening to each of the contact pads; and attaching an outer perimeter of the rigidizer to an outer perimeter of the housing. The method may also comprise the steps of: providing a sealing gasket; and aligning the sealing gasket adjacent to an outer perimeter of the window in the housing before attaching the rigidizer to the housing. The method may further comprise the steps of: forming at least one alignment hole in the printed circuit board; forming at least one alignment dimple in the rigidizer; and positioning the alignment hole in the printed circuit board adjacent to the alignment dimple in the rigidizer so that the alignment hole and the alignment dimple are capable of receiving an alignment pin on the removable connector.

Figure 2:
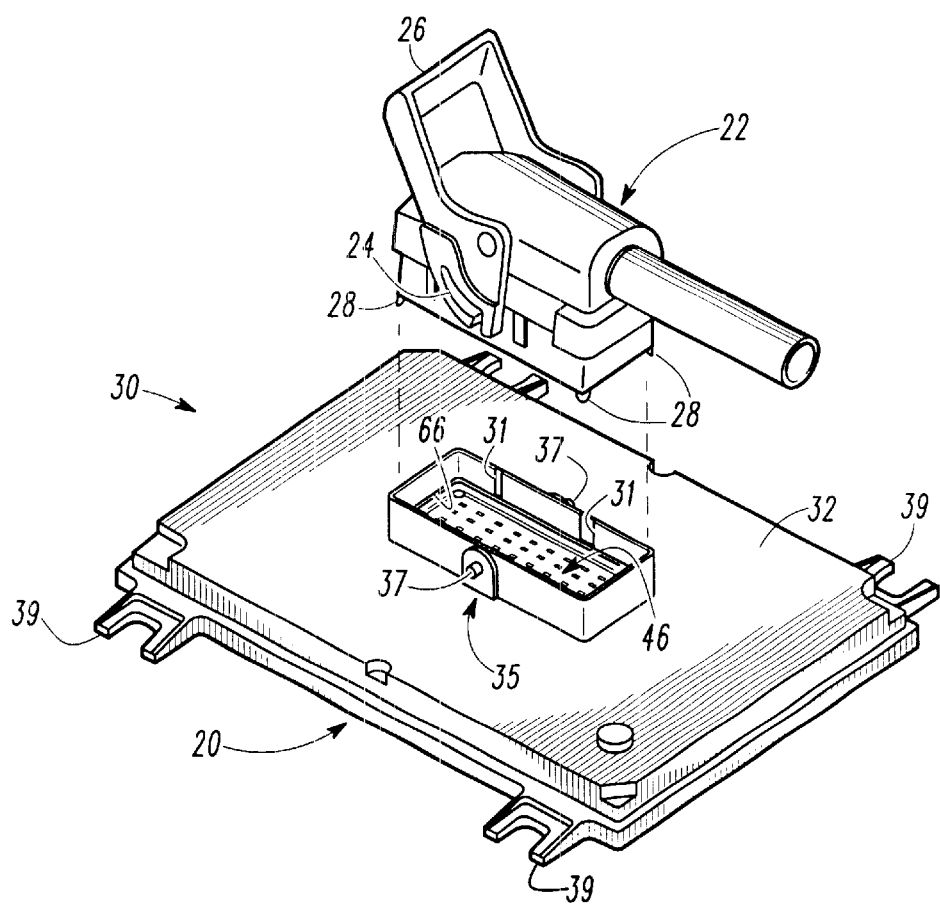
FIG. 2 is a perspective view of the electronic control module in FIG. 1 with the connector removed.
Figure 3:
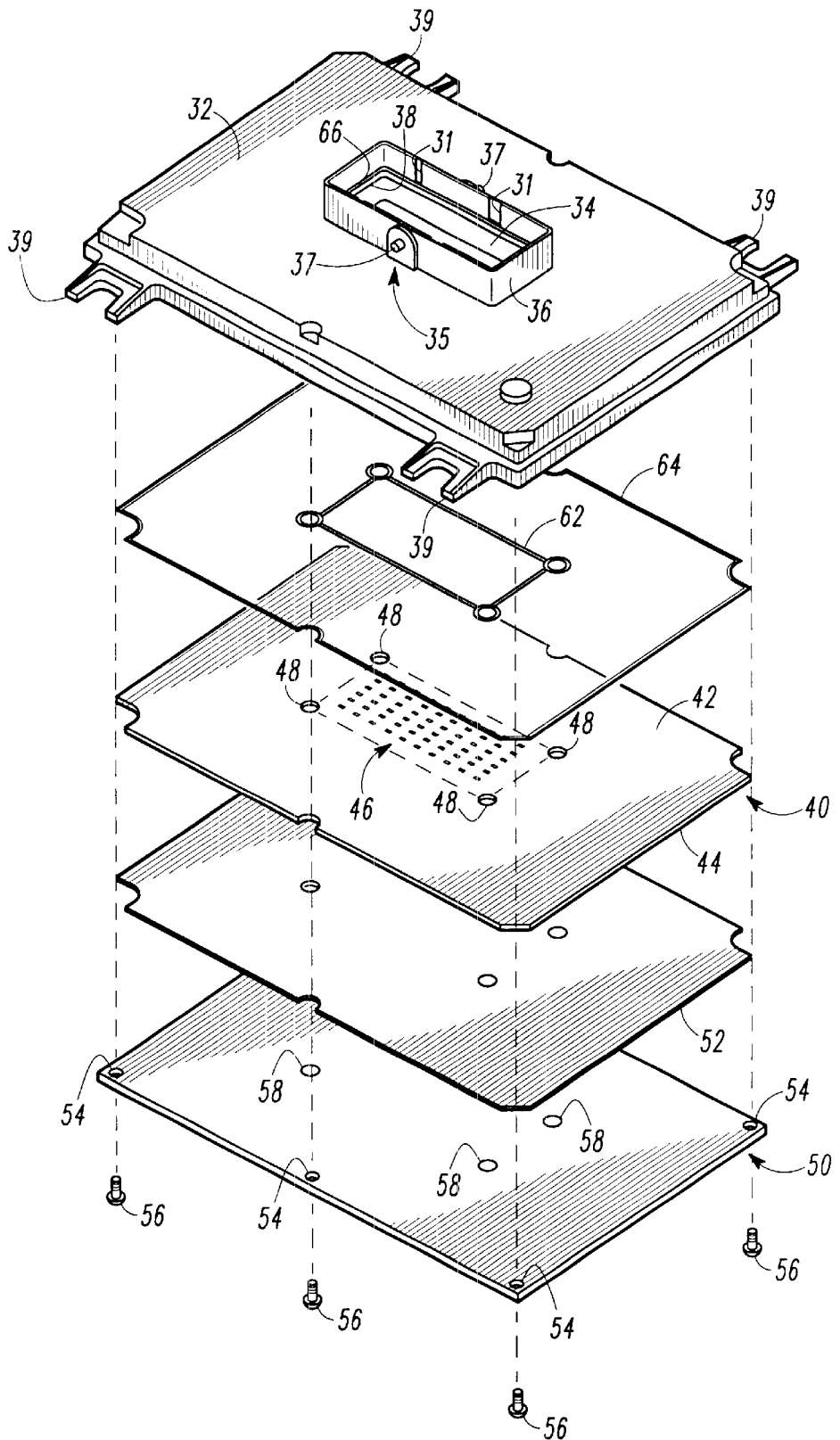
FIG. 3 is an exploded view of the electronic control module in FIG. 1.

Now, turning to the drawings, an example electronic control module will be explained. FIG. 1 shows one embodiment of an electronic control module 20 of the present invention. Attached to the electronic control module 20 is a removable connector 22. FIG. 2 shows an exploded view of the electronic control module 20 and the removable connector 22. FIG. 3 shows an exploded view of the electronic control module 20.

Referring to FIGS. 1–3, in one embodiment, the electronic control module 20 includes a housing 30, a printed circuit board 40, and a rigidizer 50. The housing 30 may have a main body portion 32, an opening or window 34, and a shroud 36. The shroud 36 surrounds an outer perimeter 38 of the window 34 and extends outwardly from the main body portion 32 of the housing 30. In one embodiment, the shroud 36 is used to partially align the removable connector 22 and to retain a latching mechanism 35 for the removable connector 22. Here, as shown in FIGS. 2–3, a set of key slots 31 may be used to guide and align the removable connector 22 to and from the shroud 36 of the housing 30. Additionally, as shown in FIGS. 1–2, the latching mechanism 35 may include, in one embodiment, a set of pins 37 that extend outwardly from the sidewall of the shroud 36. The pins 37 are used to slide into slots 24 on a latch 26 positioned on the removable connector 22. For automobile uses, the housing 30 may also have outwardly extending flanges 39 to mount the electronic control module 20 to an automobile (not shown).

The printed circuit board 40 has a first side 42, a second side 44, and a plurality of contact pads 46. The first side 42 of the printed circuit board 40 is used for mounting components and other circuitry (not shown) within a sealed internal cavity of the electronic control module 20. The exact components and circuitry are implementation specific but may include devices such as transistors, processors, and memory. As those of ordinary skill will appreciate, the device and methods described herein eliminates the need for the electronic control module 20 to have wire bonds and other complex connectors to interconnect the components and circuitry to the external environment. Thus, the manufacturing process is less complex and the assembly and product costs are reduced. In one embodiment, the printed circuit board 40 may be made of a thin flexible material such as a polyimide. The printed circuit board 40 may also be made of other materials known for retaining electrical circuits such as an epoxy glass board (FR4) and a low temperature co-fired ceramic (LTCC).

The plurality of contact pads 46 is positioned on the first side 42 of the printed circuit board 40. The contact pads 46 may be formed or otherwise plated directly on the printed circuit board 40. The contact pads 46 may be made of an electrically conductive material such as copper, nickel or gold and tied directly to circuits on the printed circuit board 40. Moreover, the opening or window 34 is positioned adjacent to the plurality of contact pads 46 on the first side 42 of the printed circuit board 40. This provides a single opening for the removable connector 22 to each of the contact pads 46. This design advantageously permits changes in the number and configuration of the contact pads on the printed circuit board without altering the design of the housing 30 and rigidizer 50. Accordingly, the present design allows for adaptive connector designs and is scalable.

The rigidizer 50 is attached to the second side 44 of the printed circuit board 40. In one embodiment, the rigidizer 50 is attached to the second side 44 of the printed circuit board 40 with a pressure sensitive adhesive 52. Although a pressure sensitive adhesive 52 is shown in the figures, other ways to attach the printed circuit board 40 to the rigidizer 50 may be used. For instance, if the printed circuit board 40 is made of LTCC, then dispensable silicon adhesive is preferred. Additionally, in other instances such as when the printed circuit board 40 is made of FR4, the rigidizer 50 may be attached to the printed circuit board 40 using a liquid epoxy.

In any event, the rigidizer 50 provides structural backing for the printed circuit board 40 to compensate for any pressure induced to the first side 42 of the printed circuit board 40 by the removable connector 22. An outer perimeter of the rigidizer 50 is attached to an outer perimeter of the housing 30. In one embodiment, the rigidizer 50 may have holes 54 for connecting the rigidizer 50 to the housing 30 by the use of mechanical fasteners such as screws 56 (shown in FIG. 3). In another embodiment, the rigidizer 50 may be attached to the housing 30 by soldering methods or an adhesive.

The housing 30 and the rigidizer 50 may be made of a metallic material or other rigid material. In one embodiment, the housing 30 and the rigidizer 50 is made of aluminum. Aluminum is less expensive than other metallic materials and is a good conductor of heat that is important for automobile applications. In another embodiment, the housing 30 may be made of plastic and the rigidizer 50 made of steel, aluminum, or other heat conducting material. The housing 30 and the rigidizer 50 are used to store and protect the components and other circuitry on the printed circuit board 40 within the electronic control module 20.

In a further embodiment, the electronic control module 20 further includes sealing gaskets 62, 64. As shown in FIG. 3, one sealing gasket 62 is positioned adjacent to the outer perimeter 38 of the window 34 in the housing 30. The other sealing gasket 64 is positioned around the printed circuit board 40 and between the housing 30 and the rigidizer 50. The gaskets 62, 64 provide additional protection and a seal to the components and circuitry on the printed circuit board 40. This is especially important when the module 20 is used in harsh environments such as for vehicle control systems.

Additionally, to provide protection and a seal to the contact pads 46 and interior components of the removable connector 22 from harsh environments, the present invention may also include an o-ring or gasket on the shroud 36.

FIGS. 2–3 show a gasket 66 on an interior surface of the shroud 36. The gasket 66 may be embedded in a groove located along the interior surface of the shroud 36. An o-ring or gasket may also be positioned on a top edge of the shroud 36, on an exterior surface of the shroud 36, or on the removable connector 22 like a surface that contacts the shroud 36.

In a preferred embodiment, as shown in FIG. 3, the printed circuit board 40 has alignment holes 48 and the rigidizer 50 has alignment dimples 58. The alignment holes 48 in the printed circuit board 40 and the alignment dimples 58 in the rigidizer 50 receive alignment pins 28 on the removable connector 22 (see FIG. 2). This allows the specific conductive connectors within the removable connector 22 to line up properly with the contact pads 46 on the printed circuit board 40.

Figure 4:
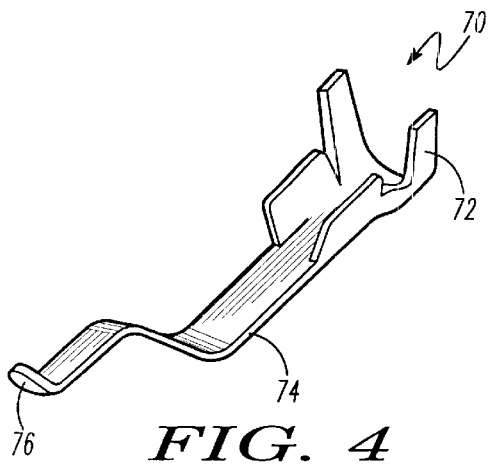
FIG. 4 is a perspective view of one embodiment of a connector that may be used with the electronic control module of the present invention.
Figure 5:
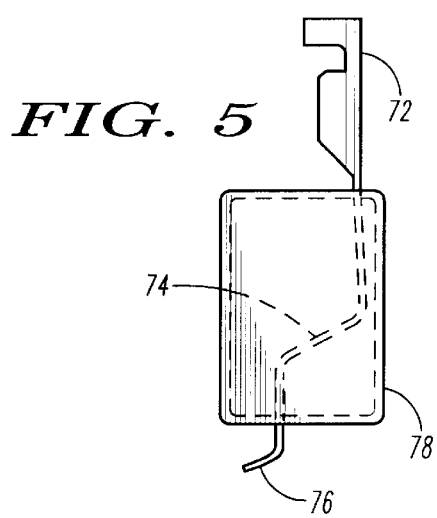
FIG. 5 is a side view of a connector that may be used with the electronic control module of the present invention.

FIGS. 4–5 illustrate one embodiment of a specific conductor connector 70 that can be located within the removable connector 22. The specific type of design for the conductor connector 70 is not a part of the present invention and is implementation specific. What is important, however, is that the conductor connector 70 be flexible and capable of applying at least some pressure on the first side 42 of the printed circuit board 40 at each contact pad 46 when locked into position. The contact pads 46 on the printed circuit board 40 need to be constantly engaged with the specific conductive connectors in the removable connector 22. For automotive applications, the connector should apply sufficient force to stay engaged in harsh vibration and temperature variations.

Here, as shown in FIGS. 4–5, the conductive connector 70 has a termination end 72, a flexible body portion 74, and a contact end 76. The flexible body portion 74 is disposed between the termination end 72 and the contact end 76. The termination end 72 may be configured for crimping to an insulated conductive wire (not shown), as is well known. In this embodiment, the contact end 76 is used to mate with one of the contact pads 46 on the printed circuit board 40. When mated with a contact pad 46 on the printed circuit board 40, the flexible body portion 74 permits the contact end 76 of the connector 70 to be constantly engaged with the contact pad 46 of the module 20.

The conductive connector 70 may be housed within a connector housing 78. Although only one conductive connector is shown in the figures, it is contemplated that the plurality of such conductive connectors 70 may be used together within the removable connector 22. In any event, the specific configuration and design of such connectors is implementation specific.

Figure 6:
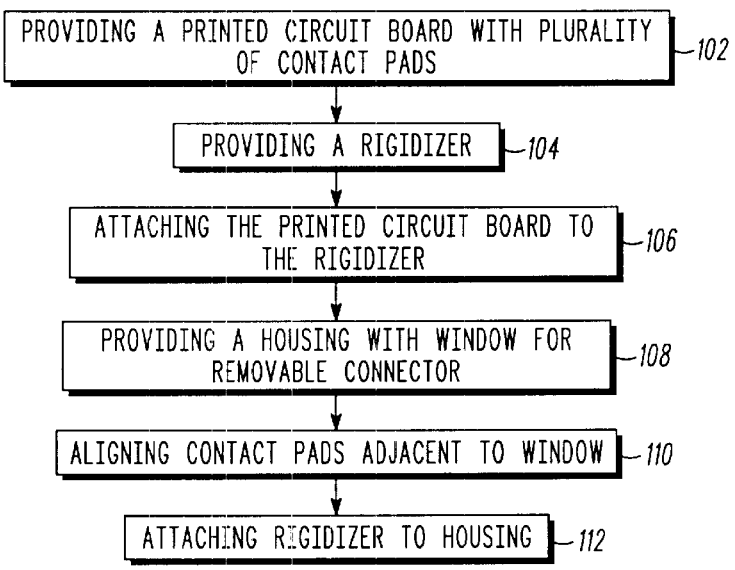
FIG. 6 is a flow diagram illustrating one method of assembling an electronic control module of the present invention.

FIG. 6 is a flow diagram that illustrates a suitable method for making or assembling an electronic control module 20 that receives a removable connector 22. In block 102, the method includes providing a printed circuit board 40 having a first side 42, a second side 44, and a plurality of contact pads 46. The plurality of contact pads 46 is positioned on the first side 42 of the printed circuit board 40. The printed circuit board 40 is used to hold and retain electrical components and circuitry for the electronic control module 20.

In block 104, the method also includes providing a rigidizer 50. As mentioned above, the rigidizer 50 may be a sheet of aluminum. In block 106, the rigidizer 50 is attached to the second side 44 of the printed circuit board 40. In one embodiment, the rigidizer 50 is attached to the printed circuit board 40 by a pressure sensitive adhesive 52.

In block 108, the method further includes providing a housing 30 that has a main body portion 32 and an opening or window 34. In one embodiment, the housing 30 is also made of a metallic material such as aluminum. The housing 30 may further include a shroud 36 that surrounds an outer perimeter 38 of the window 34 and extends outwardly from the main body portion 32 of the housing 30. The shroud 36 may include a latching mechanism 35 for the removable connector 22.

In block 110, the method includes aligning the plurality of contact pads 46 on the first side 42 of the printed circuit board 40 adjacent to the window 34 in the housing 30 such that the window 34 in the housing 30 provides a single opening to each of the contact pads 46. Moreover, in one embodiment, the method further includes the steps of providing a sealing gasket 62 and aligning the sealing gasket 62 adjacent to the outer perimeter 38 of the window 34 in the housing 30.

In block 112, the method also includes attaching the outer perimeter of the rigidizer 50 to an outer perimeter of the housing 30. The attachment can be done by mechanical fasteners such as screws 56, by soldering methods, and/or by an adhesive.

In other embodiments, the method may further comprise the steps of forming at least one alignment hole 48 in the printed circuit board 40; forming at least one alignment dimple 58 in the rigidizer 50; and positioning the alignment hole 48 in the printed circuit board 40 adjacent to the alignment dimple 58 in the rigidizer 50 so that the alignment hole 48 and the alignment dimple 58 are capable of receiving an alignment pin 28 on the removable connector 22.

The above steps may be done by a mechanical process or in connection with an automated pick-and-place machine. A benefit of the above process is that the use of wire bonds is eliminated and the use of a separate integrated connector on the housing is eliminated, both of which reduces the complexity of the assembly process. The contact pads may be directly masked onto the printed circuit board. Moreover, the process steps described above utilize conventional methods such that special equipment is not necessary.

What has been described is a module for connecting components and circuits on an internal printed circuit board to the external environment and methods of assembling the same. The present invention reduces the number of components in the electronic control module and permits the use of less costly assembly methods that can be of particular interest in high volume production. Moreover, the present invention provides better yields and increases reliability. In particular, an integral connector in the housing typically requires a reflow process that generates excess heat to the control unit. This may cause the components on the printed circuit board to be exposed to high temperatures during the reflow process. Additionally, the removal of an integral connector reduces the footprint of the connector area. This allows the control unit to accommodate higher input/output requirements in a smaller area.

The above description of the present invention is intended to be exemplary only and is not intended to limit the scope of any patent issuing from this application. The present invention is intended to be limited only by the scope and spirit of the following claims.

What is claimed is:

1. An electronic control module comprising:
   a housing having a window for a removable connector;
   a printed circuit board having a first side, a second side and a plurality of contact pads, the first side used to retain components and circuitry, the plurality of contact pads positioned on the first side of the printed circuit boards wherein the printed circuit board has at least one alignment hole; and a rigidizer attached to the second side of the printed circuit board, the rigidizer providing structural backing for the printed circuit board to compensate for any pressure induced to the first side of the printed circuit board by the removable connector, wherein the rigidizer has at least one alignment dimple for receiving an alignment pin on the removable connector;

wherein the window in the housing is positioned adjacent to the plurality of contact pads on the first side of the printed circuit board to provide a single opening to each of the contact pads.

2. The electronic control module of claim 1 wherein the housing and the rigidizer are made of aluminum.

3. The electronic control module of claim 1 wherein the housing has a shroud that surrounds an outer perimeter of the window and extends outwardly from a main body portion of the housing.

4. The electronic control module of claim 3 wherein the shroud of the housing has a latching mechanism for the removable connector.

5. The electronic control module of claim 3 wherein the shroud has a set of key slots to assist in aligning the removable connector to the housing.

6. The electronic control module of claim 3 wherein an interior surface of the shroud has a gasket to provide a seal for the contact pads.

7. The electronic control module of claim 1 further comprising a sealing gasket that is positioned adjacent to a perimeter of the window in the housing.

8. The electronic control module of claim 1 wherein the rigidizer is attached to the second side of the printed circuit board with a pressure sensitive adhesive.

9. An electronic control module comprising:

a printed circuit board having a first side, a second side and a plurality of contact pads, the first side used to retain components and circuitry, the plurality of contact pads positioned on the first side of the printed circuit board, wherein the printed circuit board has at least one alignment hole;

a housing having an opening for a removable connector, the opening positioned adjacent to the plurality of contact pads on the first side of the printed circuit to provide access to each of the contact pads; and a rigidizer attached to the second side of the printed circuit board and the housing, the rigidizer providing structural backing for the printed circuit board to compensate for any pressure induced to the first side of the printed circuit board by the removable connector, wherein the rigidizer has at least one alignment dimple for receiving an alignment pin on the removable connector.

10. The electronic control module of claim 9 wherein the housing and the rigidizer are made of aluminum.

11. The electronic control module of claim 9 wherein the housing has a shroud that surrounds an outer perimeter of the opening and extends outwardly from a main body portion of the housing.

12. The electronic control module of claim 11 wherein the shroud of the housing has a latching mechanism for the removable connector.

13. The electronic control module of claim 11 wherein the shroud has a set of key slots to assist in aligning the removable connector to the housing.

14. The electronic control module of claim 11 wherein an interior surface of the shroud has a gasket to provide a seal for the contact pads.

15. The electronic control module of claim 9 further comprising a sealing gasket that is positioned adjacent to an outer perimeter of the opening in the housing.

16. The electronic control module of claim 9 wherein the rigidizer is attached to the second side of the printed circuit board with a pressure sensitive adhesive.

17. A method for assembling an electronic control module for receiving a removable connector, the method comprising:

providing a printed circuit board having a first side, a second side and a plurality of contact pads, the plurality of contact pads on the first side of the printed circuit board;

forming at least one alignment hole in the printed circuit board;

providing a rigidizer;

forming at least one alignment dimple in the rigidizer;

positioning the alignment hole in the printed circuit board adjacent to the alignment dimple in the rigidizer so that the alignment hole and the alignment dimple are capable of receiving an alignment pin on the removable connector;

attaching the rigidizer to the second side of the printed circuit board;

providing a housing having a window for the removable connector;

aligning the plurality of contact pads on the first side of the printed circuit board adjacent to the window in the housing such that the window in the housing provides a single opening to each of the contact pads; and attaching an outer perimeter of the rigidizer to an outer perimeter of the housing.

18. The method of claim 17 further comprising the steps of:

providing a sealing gasket;

aligning the sealing gasket adjacent to an outer perimeter of the window in the housing before attaching the rigidizer to the housing.

19. The method of claim 17 wherein the step of attaching the rigidizer to the second side of the printed circuit board is done with applying a pressure sensitive adhesive between the rigidizer and the second side of the printed circuit board.

20. The method of claim 17 wherein the step of providing a housing further includes the housing having a shroud that surrounds an outer perimeter of the window and extends outwardly from a main body portion of the housing.

21. The method of claim 20 wherein the shroud of the housing has a latching mechanism for the removable connector.

* * * * *